United States Patent [19]

Kawakami

[11] Patent Number: 5,621,257
[45] Date of Patent: Apr. 15, 1997

[54] GATE DRIVE CIRCUIT FOR VOLTAGE-DRIVEN TYPE POWER SWITCHING DEVICE

[75] Inventor: Kazuto Kawakami, Tokyo, Japan

[73] Assignee: Kabushiki Kaisha Toshiba, Kawasaki, Japan

[21] Appl. No.: 473,766

[22] Filed: Jun. 6, 1995

[30] Foreign Application Priority Data

Jun. 6, 1994 [JP] Japan ................................ 6-123355

[51] Int. Cl.$^6$ ........................................... H01H 35/00
[52] U.S. Cl. ........................ 307/125; 307/116; 307/125; 363/21; 363/136; 327/384; 327/440; 327/442
[58] Field of Search ............................... 307/125, 116, 307/112; 363/136, 21; 327/440, 442, 384; 323/285

[56] References Cited

U.S. PATENT DOCUMENTS

| | | | |
|---|---|---|---|
| 4,593,204 | 6/1986 | McMurray | 327/442 |
| 5,305,192 | 4/1994 | Bonte et al. | 363/21 |
| 5,438,294 | 8/1995 | Smith | 327/384 |
| 5,450,000 | 9/1995 | Olsen | 323/222 |

Primary Examiner—William M. Shoop, Jr.
Assistant Examiner—Albert W. Paladini
Attorney, Agent, or Firm—Oblon, Spivak, McClelland, Maier & Neustadt, P.C.

[57] ABSTRACT

A gate drive circuit for a voltage-driven type power switching device, including a control device for generating a gate voltage for the voltage-driven type power switching device, and a correction device connected to the control device for receiving the gate voltage and for correcting an effect of a magnetic flux resulted from a main circuit current flowing in the voltage-driven type power switching device applied to the gate voltage to generate a corrected gate voltage. The corrected gate voltage is applied to a gate of the voltage-driven type power switching device.

9 Claims, 3 Drawing Sheets

GATE DRIVE CIRCUIT FOR VOLTAGE-DRIVEN TYPE POWER SWITCHING DEVICE

BACKGROUND OF THE INVENTION

1. Field of the Invention

This invention relates to a gate drive circuit for a voltage-driven type power switching device which controls the switching on and off of the voltage-driven type power switching device.

2. Description of the Related Art

As a voltage-driven type power switching device, an insulated gate bipolar transistor (hereafter, abbreviated as IGBT) or a field effect transistor is used. Each of these devices has a large gate input impedance, and on-off switching control thereof can be effected by applying a gate voltage to a gate thereof.

A conventional gate drive circuit for an IGBT is shown in FIG. 6. In FIG. 6, a gate voltage $v_G$ output from a control device 2 for controlling the on/off switching of an IGBT 1 is supplied between the gate and emitter of IGBT 1 by means of a signal wire 3, such as a twisted pair wire or the like.

In this case, the wiring is made such that the effect of the magnetic flux due to the main circuit current flowing in the conductor connected to the collector or emitter of IGBT 1 is made as small as possible.

However, in reality, it is not possible completely to eliminate the effect of the magnetic flux resulted from the main circuit current due to the relative physical positioning. Therefore, there are cases where an induced voltage due to this magnetic flux is produced in signal wire 3, which has an adverse effect on a voltage $v_{GE}$ between the gate and emitter of IGBT 1.

For example, an induced voltage $v_X$ is produced in one part of signal wire 3 by change in a magnetic flux $\Phi$ due to change in an emitter current $i_E$ of IGBT 1. There are cases where the polarity of this induced voltage $v_X$ is in the direction, as shown in FIG. 7 whereby voltage $v_{GE}$ applied between the gate and eimtter of IGBT 1 rises or falls when emitter current $i_E$ changes in the direction of an increase or a decrease, respectively. In this case, the following problems arise.

Specifically, when the main circuit current flowing in the collector and emitter of IGBT 1 changes in the direction of an increase, if voltage $v_{GE}$ between the gate and emitter of IGBT 1 rises, a voltage $v_{CE}$ between the collector and emitter of IGBT 1 is caused to fall, and thereby a positive feedback action is produced causing the main circuit current to further rise. Therefore, there is the danger that when there is a sudden increase in the main circuit current in IGBT 1 due to shorting of the load, fop example, voltage $v_{GE}$ between the gate and emitter rises, to thereby cause the main circuit current to rise further, and as a result, IGBT 1 cannot be protected from an overcurrent and may be damaged.

Furthermore, when the main circuit current flowing in IGBT 1 changes in the direction of a decrease, if voltage $v_{GE}$ between the gate and emitter falls, voltage $v_{CE}$ between the collector and emitter is caused to rise, and thereby a positive feedback effect is produced causing the main circuit current to further fall. Therefore, there is the danger that when gate voltage $v_G$ output from control device 2 is reduced at a prescribed rate of decrease and the main circuit current in IGBT 1 is reduced to zero, the main circuit current is caused further to fall suddenly due to the positive feedback action, and an excess voltage between the collector and emitter of IGBT 1 is produced by a back e.m.f. resulted from a floating inductance (not shown in drawing) present in the main circuit, and this may cause damage to IGBT 1.

Furthermore, even if IGBT 1 is not damaged by the over current or overvoltage as described above, there is the risk that high-frequency oscillations may be produced in the main circuit current in IGBT 1 due to the aforementioned positive feedback action, which may adversely affect the life etc. of IGBT 1.

SUMMARY OF THE INVENTION

Accordingly, one object of this invention is to provide a gate drive circuit for a voltage-driven type power switching device which can perform a stable switching control of the voltage-driven type power switching device.

Another object of this invention is to provide a gate drive circuit for a voltage-driven type power switching device which can reduce an adverse effect of the magnetic flux density due to the main circuit current flowing in the voltage-driven type power switching device applied to the gate voltage.

Still another object of this invention is to provide a gate drive circuit for a voltage-driven type power switching device which can prevent an adverse effect of a positive feedback action by the magnetic flux density due to the main circuit current flowing in the voltage-driven type power switching device applied to the gate voltage.

These and other objects of this invention can be achieved by providing a gate drive circuit for a voltage-driven type power switching device, including a control device for generating a gate voltage for the voltage-driven type power switching device, and a correction device connected to the control device for receiving the gate voltage and for correcting an effect of a magnetic flux resulted from a main circuit current flowing in the voltage-driven type power switching device applied to the gate voltage to generate a corrected gate voltage. The corrected gate voltage is applied to a gate of the voltage-driven type power switching device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
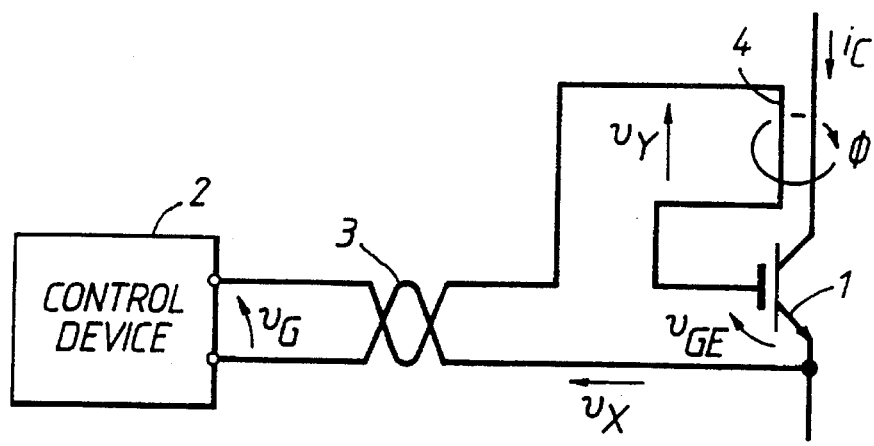
FIG. 1 is a circuit diagram showing a gate drive circuit for a voltage-driven type power switching device according to an embodiment of this invention.

Referring now to the drawings, wherein like reference numerals designate identical or corresponding parts throughout the several views, the embodiments of this invention will be described below.

Figure 6:
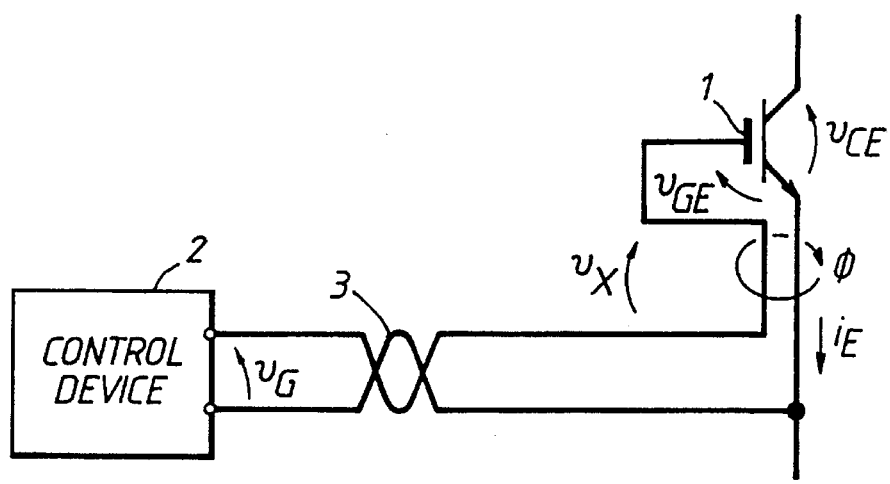
FIG. 6 is a circuit diagram showing one example of a conventional gate drive circuit for a voltage-driven type power switching device.
Figure 7:
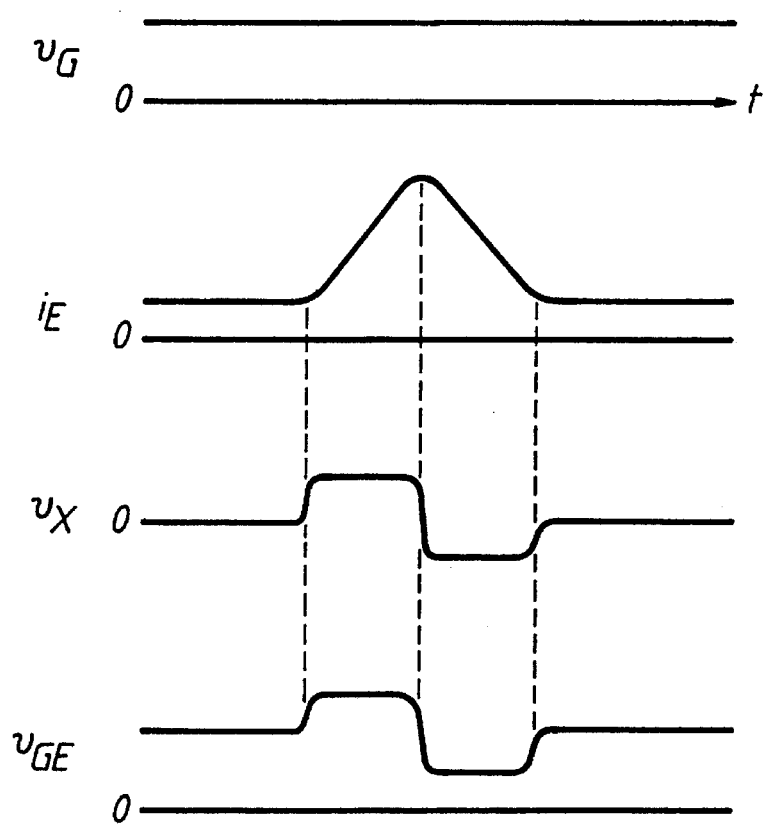
FIG. 7 is a waveform diagram for explaining the action of the conventional gate drive circuit shown in FIG. 6.

An embodiment of this invention is shown in FIG. 1. In this Figure, IGBT 1, control device 2, and signal wire 3 are the same as in the prior art shown in FIG. 6. A coupling wire 4 with an electromagnetic coupling actively to a conductor connected to the collector of IGBT 1 is newly provided. This embodiment is constructed such that a gate voltage $v_G$ output from control device 2 is supplied between the gate and emitter of IGBT 1 through this coupling wire 4.

Figure 2:
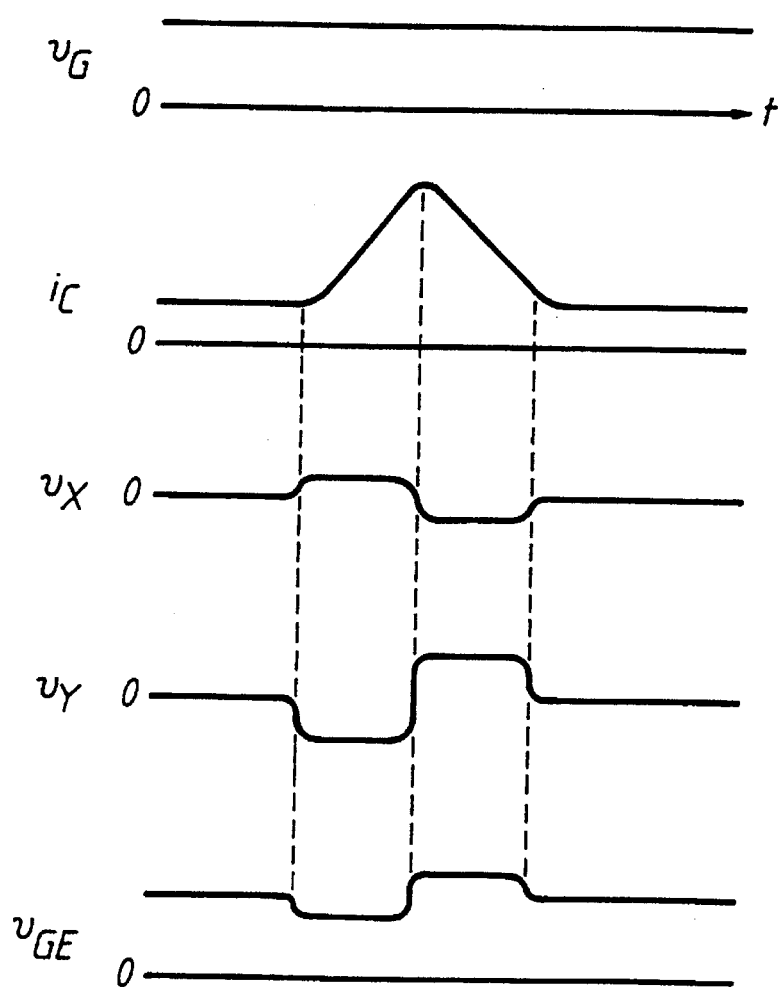
FIG. 2 is a waveform diagram for explaining the action of the embodiment shown in FIG. 1.

In the aforementioned construction, when a gate voltage $v_G$ is output from the control device 2 and a current $i_C$ is flowing in the collector of IGBT 1, an induced voltage $v_Y$ corresponding to a rate of change $di_C/dt$ in this current $i_C$ is produced in coupling wire 4. This induced voltage $v_Y$ is added to gate voltage $v_G$, and acts such that when current $i_C$ changes in the direction of an increase or a decrease, voltage $v_{GE}$ supplied between the gate and emitter of IGBT 1 falls or rises, as shown in FIG. 2. Thereby, the positive feedback action of voltage $v_X$ induced in signal wire 3 is cancelled out, and furthermore, it is possible to apply a negative feedback action.

Furthermore, coupling wire 4 can be implemented such that it is provided on a printed circuit board installed close to IGBT 1 and the coupling coefficient of the electromagnetic coupling can be adjusted.

Thus, it is possible to reduce the positive feedback action, to cancel out the positive feedback action or apply negative feedback action, by the adjustment of the coupling coefficient of the electromagnetic coupling.

Figure 3:
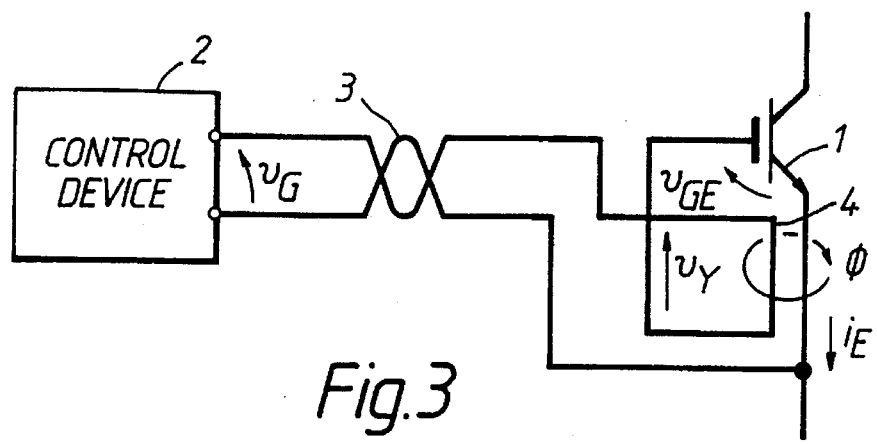
FIG. 3 is a circuit diagram showing a gate drive circuit for a voltage-driven type power switching device according to another embodiment of this invention.

Another embodiment of this invention is shown in FIG. 3. This Figure shows a case where coupling wire 4 with electromagnetic coupling actively to a conductor connected to the emitter of IGBT 1 is provided. Emitter current $i_E$ of IGBT 1 is virtually the same as collector current $i_C$, and the similar operation and effect as that of the embodiment described above can be obtained.

Figure 4:
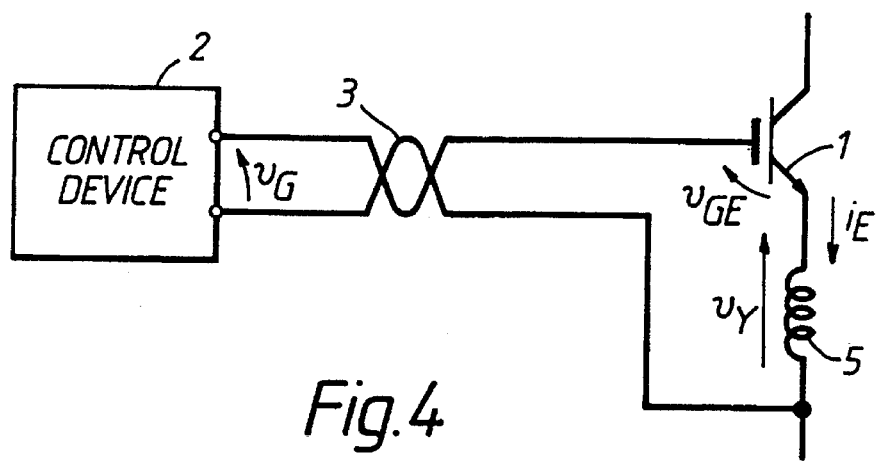
FIG. 4 is a circuit diagram showing a gate drive circuit for a voltage-driven type power switching device according to still another embodiment of this invention.

Still another embodiment of this invention is shown in FIG. 4. In this embodiment, an impedance element 5, such as a reactor, is connected in series to the emitter side of IGBT 1. The construction of this embodiment is such that gate voltage $v_G$ output from control device 2 is supplied via signal wire 3 between the gate of IGBT 1 and one terminal (non-emitter side) of impedance element 5.

In the foregoing construction, when gate voltage $v_G$ is output and emitter current $i_E$ flows in IGBT 1, voltage drop $v_Y$ resulted from emitter current $i_E$ is produced in impedance element 5. This voltage $v_Y$ acts in a direction causing the voltage $v_{GE}$ applied between the gate and emitter of IGBT 1 to fall, thus acting as a negative feedback. Furthermore, when an inductance element is used as impedance element 5, voltage drop $v_Y$ corresponding to the rate of current change $di_E/dt$ in emitter current $i_E$ is produced in the inductance element, and a similar action to those in the previously described embodiments can be achieved.

Figure 5:
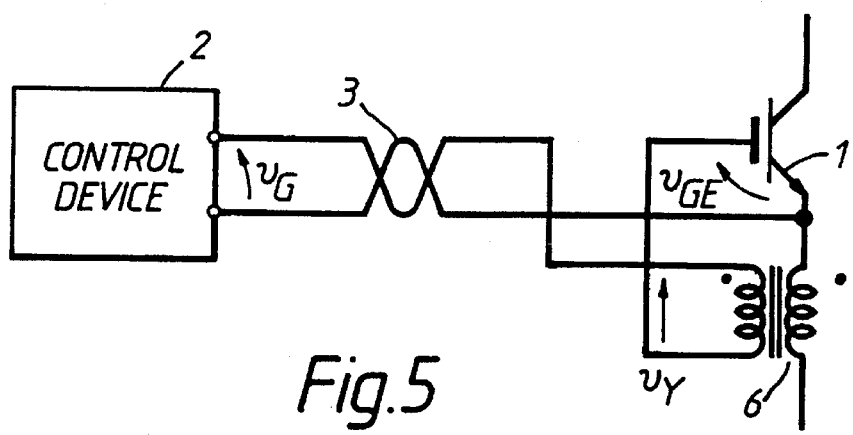
FIG. 5 is a circuit diagram showing a gate drive circuit for a voltage-driven type power switching device according to a further embodiment of this invention.

A further embodiment of this invention is shown in FIG. 5. The construction of this embodiment is such that the primary winding of a transformer 6 is connected in series to the emitter side of IGBT 1, and in supplying a gate voltage $v_G$ output from control device 2 between the gate and emitter of IGBT 1 by means of signal wire 3, the secondary winding of transformer 6 is inserted intermediately in this signal wire 3.

In the foregoing construction, when emitter current $i_E$ is flowing in IGBT 1, induced voltage $v_Y$ corresponding to the rate of current change $di_E/dt$ of emitter current $i_E$ is produced in the secondary winding of transformer 6. A similar action to those in the previously described embodiments can be achieved.

With these embodiments, it is possible to cancel out the previously described positive feedback action and moreover, to apply a negative feedback action. For example, when there is a sudden increase in the main circuit current in IGBT 1 due to shorting of the load or the like, it is possible to prevent IGBT 1 from being damaged by overcurrent by preventing that voltage $v_{GE}$ between the gate and emitter to rise, causing the main circuit current to further rise. Furthermore, it is possible to prevent IGBT 1 from being damaged by overvoltage by preventing that the excess voltage is produced between the collector and emitter of IGBT 1, when gate voltage $v_G$ is reduced at a prescribed rate of decrease and the main circuit current of IGBT 1 is caused to fall to zero.

Moreover, the production of high-frequency oscillations in the main circuit current of IGBT 1 can also be prevented, and the operational reliability of IGBT 1 can be increased.

According to the present invention, it is possible to provide a gate drive circuit for voltage-drive type power switching device whereby the voltage between the gate and emitter of a voltage-driven type power switching device can be prevented from the adverse effects by the magnetic flux due to the collector current or emitter current, and stable switching control can be performed.

Obviously, numerous modifications and variations of the present invention are possible in light of the above teachings. It is therefore to be understood that within the scope of the appended claims, the invention may be practiced otherwise than as specifically described herein.

What is claimed is:

1. A gate drive circuit for a voltage-driven type power switching device having at least one of a collector circuit and an emitter circuit, comprising:

control means for generating a gate voltage for said voltage-driven type power switching device; and correction means connected to said control means for receiving said gate voltage and connected to at least one of said collector circuit and said emitter circuit for producing a correction voltage that is applied to said gate voltage in order to compensate for an induced voltage which is inductively applied to said gate voltage and is caused by a magnetic flux from a main circuit current flowing in said voltage-driven type power switching device, wherein said gate voltage, said correction voltage, and said induced voltage form a corrected gate voltage, said corrected gate voltage being applied to a gate of said voltage-driven type power switching device.

2. The gate drive circuit for a voltage-driven type power switching device according to claim 1, wherein:

said correction means generates said corrected gate voltage by correcting said gate voltage such that when said main circuit current changes in a direction of an increase said gate voltage is caused to fall and when said main circuit current changes in a direction of a decrease said gate voltage is caused to rise.

3. The gate drive circuit for a voltage-driven type power switching device according to claim 1, wherein:

said correction means generates said corrected gate voltage by adjusting a factor of correcting said effect of said magnetic flux to said gate voltage.

4. The gate drive circuit for a voltage-driven type power switching device according to claim 1, wherein:

said correction means includes a coupling wire with an electromagnetic coupling to a conductor connected to at least one of said collector circuit and emitter of circuit voltage-driven type power switching device, and said gate voltage is applied to said gate of said voltage-driven type power switching device through said coupling wire as said corrected gate voltage.

5. The gate drive circuit for a voltage-driven type power switching device according to claim 4, wherein:

said correction means generates said corrected gate voltage by correcting said gate voltage such that when said main circuit current flowing through said conductor changes in a direction of an increase said gate voltage is caused to fall by a voltage induced in said coupling wire and when said main circuit current flowing through said conductor changes in a direction of a decrease said gate voltage is caused to rise by said voltage induced in said coupling wire.

6. The gate drive circuit for a voltage-driven type power switching device according to claim 4, wherein:

said correction means generates said corrected gate voltage by adjusting a coupling coefficient of said electromagnetic coupling between said conductor and said coupling wire.

7. The gate drive circuit for a voltage-driven type power switching device according to claim 1, wherein:

said correction means includes an impedance element connected in series to said emitter circuit of said voltage-driven type power switching device, and said gate voltage is applied between said gate and one terminal of said impedance element to which said emitter circuit is not connected, whereby said corrected gate voltage is applied between said gate and said emitter circuit of said voltage-driven type power switching device.

8. The gate drive circuit for a voltage-driven type power switching device according to claim 7, wherein:

in said correction means, said impedance element includes an inductance element.

9. The gate drive circuit for a voltage-driven type power switching device according to claim 1, wherein:

said correction means includes a transformer with a primary winding connected in series to said emitter circuit and a secondary winding connected between said control means and said gate of said voltage-driven type power switching device, and said gate voltage is applied between said emitter and said gate through said secondary winding of said transformer, whereby said corrected gate voltage is applied between said gate and said emitter circuit of said voltage-driven type power switching device.

* * * * *